US007362112B2

(12) United States Patent
Yang et al.

(10) Patent No.: US 7,362,112 B2
(45) Date of Patent: *Apr. 22, 2008

(54) SIGNAL ACQUISITION PROBE HAVING A RETRACTABLE DOUBLE CUSHIONED PROBING TIP ASSEMBLY

(75) Inventors: Kei-Wean C. Yang, Beaverton, OR (US); Mark W. Nightingale, Washougal, WA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/139,103

(22) Filed: May 27, 2005

(65) Prior Publication Data

US 2006/0267602 A1 Nov. 30, 2006

(51) Int. Cl.
*G01R 31/02* (2006.01)
*G01R 1/067* (2006.01)
(52) U.S. Cl. ................. 324/754; 324/761; 324/72.5
(58) Field of Classification Search ........ 324/754–765, 324/72.5
See application file for complete search history.

(56) References Cited

U.S. PATENT DOCUMENTS

| 4,721,903 | A  | * | 1/1988  | Harsch et al. ............. 324/72.5 |
| 6,466,000 | B1 |   | 10/2002 | Nightingale |
| 6,677,772 | B1 | * | 1/2004  | Faull ......................... 324/761 |
| 6,704,670 | B2 |   | 3/2004  | McTigue |
| 6,734,689 | B1 | * | 5/2004  | Yang ......................... 324/754 |

OTHER PUBLICATIONS http://www.candox.co.jp/, Candox Systems, Inc., CP400-04 probe.

* cited by examiner

*Primary Examiner*—Ha Tran Nguyen
*Assistant Examiner*—Emily Y Chan
(74) *Attorney, Agent, or Firm*—William K. Bucher

(57) ABSTRACT

A signal acquisition probe has a double cushioned spring loaded probing tip assembly disposed in a housing. A first compressive element produces a first pre-loaded compressive force and an increasing compressive force on the probing tip assembly and a second compressive element produces a second pre-loaded compressive force and an increasing compressive force on the probing tip assembly subsequent to the first increasing compressive force. First and second double cushioned spring loaded probing tip assemblies may be disposed in a housing to produce a differential signal acquisition probe.

18 Claims, 7 Drawing Sheets

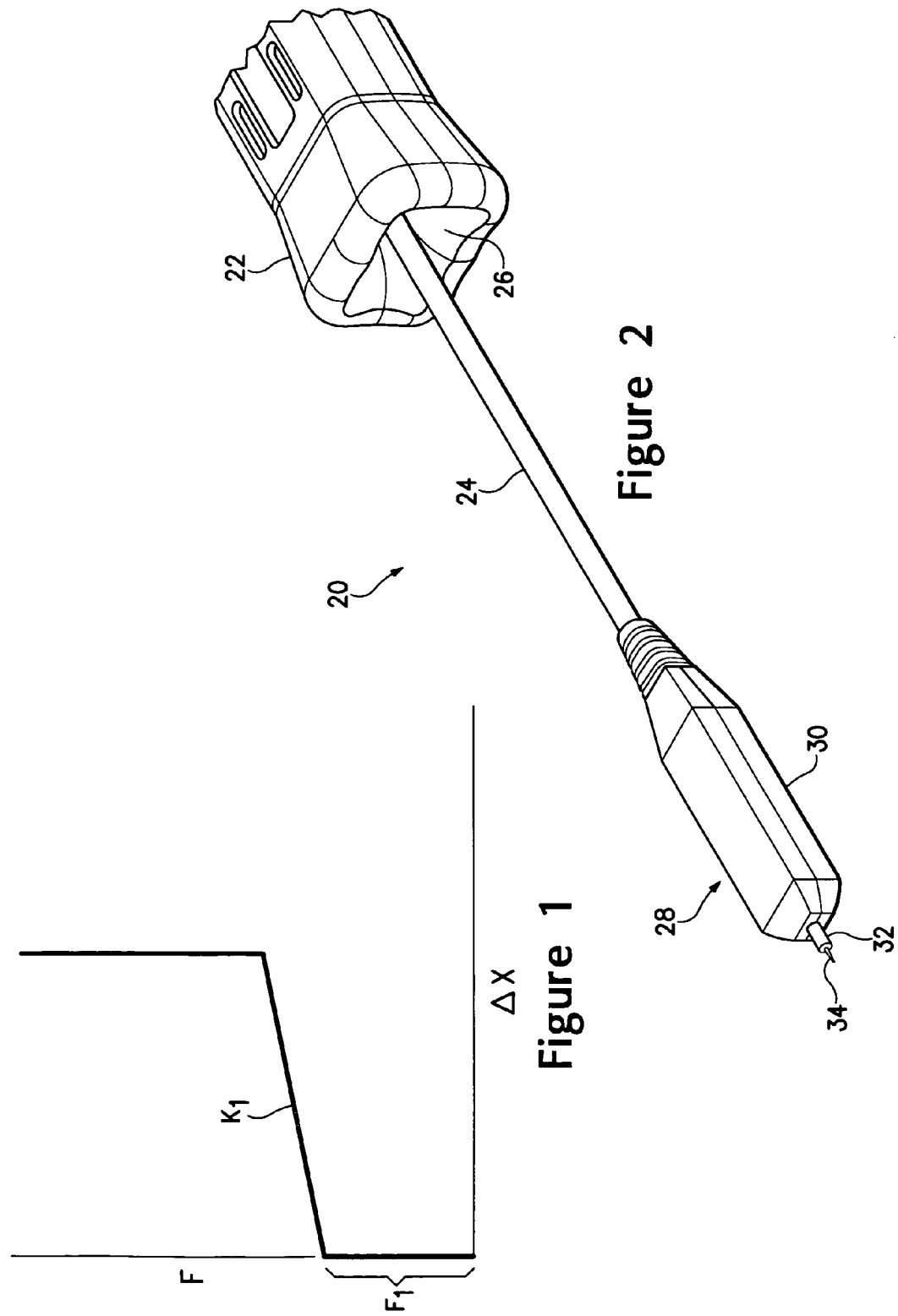

SIGNAL ACQUISITION PROBE HAVING A RETRACTABLE DOUBLE CUSHIONED PROBING TIP ASSEMBLY

BACKGROUND OF THE INVENTION

The present invention relates generally to signal acquisition probes and more particularly to a signal acquisition probe having a retractable double cushioned probing tip assembly.

Signal acquisition probes acquire electrical signals from a device under test and couple the acquired signal to a measurement instrument, such as an oscilloscope or the like, via an electrical cable. A typical signal acquisition probe acquires voltage signals from a device under test and has a probe head with an electrically conductive hollow tube having a substrate disposed therein. The substrate has passive or active circuitry for conditioning the acquired signal prior to being coupled to the measurement instrument. One end of the hollow tube has an insulating plug disposed therein with a coaxially disposed probing tip extending out of the plug in both directions. The portion of the probing tip extending into the hollow tube is electrically connected to the substrate. Generally, voltage signal acquisition probes are used in hand-held probing of a device under test or mounted to a probing arm that is positioned on the device under test. Excessive force applied to the measurement probe can break the probing tip requiring replacement. Generally, this requires the measurement probe to be sent to a service center where experienced technicians take the probe apart and replace the broken tip. This results in the loss of use of the probe during the repair period and the expense of the repair.

U.S. Pat. No. 6,466,000 describes a replaceable probe tip holder and measurement probe head that allows a user to replace a broken probe tip without sending it to a service center. The replaceable probe tip holder has a cap and attachment arms extending away from the back end of the cap that are positionable on the outside of a probe head housing. The cap has a series of cavities from therein and a bore extending from the innermost cavity to the front end of the cap. A resilient compression member is positioned in the innermost cavity and a probing tip is passed through the resilient compression member and disposed in the bore with the probing point extending outward from the cap. The other end of the probing tip is flared out to form a head that sandwiches the resilient compression member between cap and the probing tip head. Adjacent to the innermost cavity is a second cavity that receives a portion of a substrate that is disposed in a probe head housing. The end face of the substrate has at least a first electrical contact that mates with the head of the probing tip. A third cavity receives a portion of the probe head housing. It should be noted that the probing tip is not securely mounted in the cap of the replaceable probing tip holder and that the probing tip is only securely mounted in the replaceable probe tip holder when the holder is positioned on the probe head.

As the bandwidth of measurement increases, there is a corresponding need for measurement probes having greater bandwidths. A major difficulty in designing very wide bandwidth measurement probes having bandwidths of 5 GHz and greater is the effects of capacitance and inductance of the probing tip or tips. One solution to this problem is to separate the probing tips from the active circuitry in the probing head of the measurement probe. U.S. Pat. No. 6,704,670 describes a wideband active probing system where the probing tip or tips of the probe are separable from a probe amplifier unit. One or more probe cables are connected to a probe tip unit which are connected to the probe amplifier unit for conveying signals received by a probe unit. Various types of probe tip units may be connected to the probe amplifier unit. One type of probe tip unit is a browser probe tip unit which may either be a single ended probe tip unit head or a differential probe tip unit.

The browser probe tip unit includes at least a first typically cylindrical probe barrel. The probe barrel is constructed of an electrically conductive material and extends partially outside of a probe tip unit housing. A probe barrel nose cone is attached to the exposed probe barrel. The probe nose cone is generally conical in form and made of an insulating material. The longitudinal axis of the probe barrel nose cone extends from the probe barrel at an offset angle from the longitudinal axis of the probe barrel. A typically cylindrical shaped probe tip extends partially out of the end of the probe barrel nose cone and is make of an electrically conductive material. A probe cable having an outer shielding conductor and a central signal conductor is connected to the probe barrel and the probe tip with the outer shielding conductor being connected to the probe barrel and the signal conductor being connected to the probe tip. An elastic compressible element engages the probe barrel and the probe tip unit housing allowing movement of the probe barrel into and out of the probe tip unit housing. For a single ended measurement probe, a retractable ground tip is attached to the probe barrel. For a differential measurement probe, two probe barrel and probe nose cone assemblies are positioned side by side in a probe tip unit housing. Individual elastic compressible elements are provided for each assembly. Individual coaxial cables are attached to each assembly.

FIG. 1 shows the forces applied to the probe barrel and probe nose cone assembly or assemblies during use, where "F" is the force applied to the probe nose cone, $\Delta X$ is the displacement of the elastic compressible element from its equilibrium position, and $K_1$ is the spring constant. Assuming that the elastic compressible element or elements are pre-loaded, there in an initial force on the assembly or assemblies as represented by the force $F_1$. Downward force on the probe unit housing causes the assembly or assemblies to retract into the probe unit housing. The downward force on the probe unit housing exerts an increasing force $K_1$ on the assembly or assemblies following Hook's Law of $F=K_1 \Delta X$ where $K_1$ is the spring constant. When the elastic compressible element or elements are completely compressed or the assembly or assemblies engage a fixed stop, continued downward pressure on the probe unit housing transfers forces to the assembly or assemblies as represented by the vertical force line.

U.S. Pat. No. 6,734,689 describes a measurement probe providing signal control for an EOS/ESD protection module. The measurement probe has a spring loaded coaxial probe assembly and a pressure sensor that work in combination to provide an activation signal to the control module. The spring loaded coaxial cable assembly and pressure sensor are disposed in a probe housing. The spring loaded coaxial probe assembly has a semi-rigid coaxial cable with one end forming a probing tip and the other end having a threaded connector. A flexible coaxial is connected to the threaded connector and to the control module. The pressure sensor has a first electrically conductive contact fixed to the coaxial probe assembly and a second electrically conductive contact fixed in the probe housing. A compression spring is positioned over the semi-rigid coaxial cable with one end secured to the semi-rigid coaxial cable and the other end engaging the probe housing. The compression spring is pre-loaded to apply an initial force $F_1$ to the spring loaded coaxial probe assembly as shown graphically in FIG. 1. As downward pressure is applied to probe housing, the coaxial probe assembly retracts into the probe body. The compression spring exerts increasing pressure on the coaxial probe assembly following Hook's Law of $F=K_1 \Delta X$ where $K_1$ is the compression spring constant. Continued downward pressure applied to the probe housing results in pressure sensor contacts making contact. Since the pressure sensor contacts are fixed to the semi-rigid coaxial cable and the probe housing, any continued downward pressure on the probe housing transfers the forces to the pressure sensor and the coaxial probe assembly as represented in FIG. 1 by the vertical force line. The excess forces on the pressure sensor and the coaxial probe assembly may result in damage to the pressure sensor or the coaxial probe assembly.

A signal acquisition probe for TDR applications is the CP400-04, manufactured by Candox System of Japan. This probe has a metal housing in which an insulated signal conductor is disposed. The metal housing has a threaded connector at one end for connecting a signal cable. The other end of the housing has apertures for receiving spring action pogo pins. One pogo pin is coupled to the insulated signal conductor and the other pogo pins are connected to the metal housing. Assuming that the retractable portion of the pogo pin is pre-loaded, the force on the retractable portion of the pogo pins is similar to that of FIG. 1. The pre-loaded retractable portion has an initial force $F_1$. Downward pressure on the metal housing creates an increasing force on the retractable portion of the pogo pin as represented by line $K_1$. Once all the compression force is taken up in the pogo pin or the pogo pin housing, any further force exerted on the pogo pins is applied to the retractable member as represented by the vertical force line. This may result in damage to the pogo pins.

What is needed is a signal acquisition probe providing a double cushioned retractable probing tip assembly. The signal acquisition probe should provide a safety zone for minimizing probe damage due to excess force being applied to the probing tip assembly. Further, the signal acquisition probe should provide an indication to a user that adequate pressure has been applied to the probing tip assembly so as to prevent damage to the assembly. Additionally, first and second double cushioning retractable probing tips assemblies may be combined in a differential signal acquisition probe.

SUMMARY OF THE INVENTION

Accordingly, the present invention is a signal acquisition probe having a probing tip assembly disposed within a housing. A first compressible element is disposed within the housing and applies a first pre-loaded compressive force to the probing tip assembly and a first increasing compressive force by axial movement of the housing relative to the probing tip assembly. A second compressible element is disposed within the housing and applies a second pre-loaded compressive force to the probing tip assembly subsequent to the application of the first increasing compressive force with the second compressible element applying a second increasing compressive force by further axial movement of the housing relative to the probing tip assembly.

In the preferred embodiment, the probing tip assembly is a semi-rigid coaxial cable having a probing tip at one end. A connector may be positioned at the other end of the semi-rigid coaxial cable. The housing preferably has first and second housing members receiving the coaxial probe assembly, the first compressible element, and the second compressible element.

In a first embodiment, the first compression element is a first compression spring positioned on the semi-rigid coaxial cable with one end of the first compression spring fixedly positioned on the semi-rigid coaxial cable and the other end of the first compression spring abutting a transverse wall in the housing. The first compression spring is compressed between the fixed position on the semi-rigid coaxial cable and the transverse wall in the housing to generate the first pre-loaded compressive force. The second compressible element is a second compression spring positioned on the semi-rigid coaxial cable and disposed in the housing between opposing transverse walls. A pressure plate is positioned on the semi-rigid coaxial cable and against one end of the second compression spring. The second compression spring is compressed between the opposing transverse walls of the housing to generate the second pre-loaded compressive force. An actuator is fixedly positioned on the semi-rigid coaxial cable and engages the pressure plate positioned against the second compression spring. The actuator preferably has a base plate secured to the semi-rigid coaxial cable and at least a first protrusion extending from the base plate for engaging the pressure plate. The first protrusion preferably passes through a bore formed in the transverse wall abutting the pressure plate.

In a further embodiment, the first compressible element is a first elastomeric material positioned around the semi-rigid coaxial cable with one end of the first elastomeric material fixedly positioned to the semi-rigid coaxial cable. The other end of the first elastomeric material abuts a transverse wall in the housing with the first elastomeric material being compressed between the fixed position on the semi-rigid coaxial cable and the transverse wall in the housing to generate the first pre-loaded compressive force. The second compressible element is a second elastomeric material positioned around the semi-rigid coaxial cable and disposed in the housing between opposing transverse walls. The second elastomeric material is compressed between the opposing transverse walls of the housing to generate the second pre-loaded compressive force. An actuator is fixedly positioned on the semi-rigid coaxial cable and engages the second elastomeric material. The actuator preferably has a base plate secured to the semi-rigid coaxial cable and at least a first protrusion extending from the base plate for engaging the second elastomeric material. The protrusion preferably passes through a bore formed in the transverse wall abutting the elastomeric material.

In still a further embodiment of the present invention first and second probing tip assemblies are disposed within a housing to form a differential signal acquisition probe. The differential signal acquisition probe has first compressible elements disposed within the housing with one of the compressible elements applying a first pre-loaded compressive force to the first probing tip assembly and a first increasing compressive force by axial movement of the housing relative to the first probing tip assembly. The other first compressible element is disposed within the housing and applies a first pre-loaded compressive force to the second probing tip assembly and a first increasing compressive force by axial movement of the housing relative to the second probing tip assembly. Second compressible elements are disposed within the housing with one of the second compressible elements applying a second pre-loaded compressive force to the first probing tip assembly subsequent to the application of the first increasing compressive force and a second increasing compressive force by further axial movement of the housing relative to the first probing tip assembly. The other second compressible elements applies a second pre-loaded compressive force to the second probing tip assembly subsequent to the application of the first increasing compressive force and a second increasing compressive force by further axial movement of the housing relative to the second probing tip assembly. The various embodiments of the first and second probing tip assemblies, first and second compressible elements are the same as previously described. The housing is formed of first and second housing members receiving the first and second coaxial probe assemblies, the first compressible elements, and the second compressible elements.

The objects, advantages and novel features of the present invention are apparent from the following detailed description when read in conjunction with appended claims and attached drawings.

BRIEF DESCRIPTION OF THE DRAWINGS

FIG. 1 is a graphical representation of the forces applied to a probing tip of representative existing probe assemblies.

FIG. 2 is a perspective view of a measurement probing system incorporating the signal acquisition probe according to the present invention.

DETAILED DESCRIPTION OF THE PREFERRED EMBODIMENT

Figure 3:
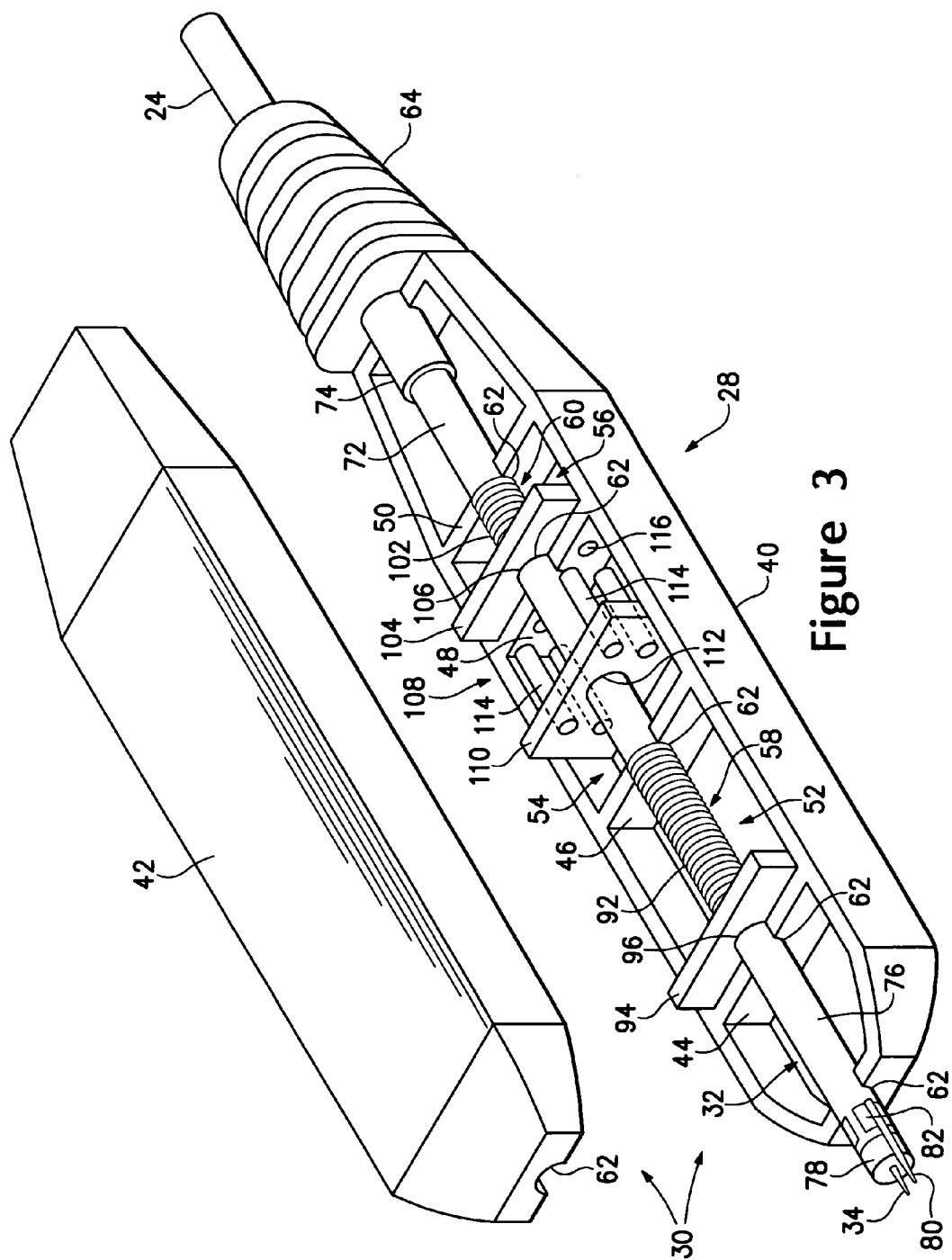
FIG. 3 is a partially exploded view of a first embodiment of the signal acquisition probe according to the present invention.

Referring to FIG. 2, there is shown a measurement probing system 20 that includes a probe body 22 electrically coupled to a measurement test instrument (not shown), such as an oscilloscope or the like, via a coaxial cable (not shown). The coaxial cable also contains power and signal lines that provide electrical power to active circuitry in the probe body 22 and communication signals to and from the probe body 22 for controlling the active circuitry. A coaxial cable 24 extends from the probe body 22 through an inverted strain relief 26 and is coupled to a signal acquisition probe having a retractable double cushioned probing tip assembly 28 according to the present invention. The signal acquisition probe 28 has a housing 30 in which is disposed a probing tip assembly 32 and first and second compressible elements to be described in greater detail below. The probing tip assembly 32 is formed with a probing tip 34 that extends outward from one end of the housing 30.

Referring to FIG. 3, there is shown a perspective view of the interior of the signal acquisition probe 28. The housing 30 has first and second housing members 40, 42 formed of an insulating material, such as ABS plastic, polycarbonate, or the like. Each housing member 40, 42 is substantially a mirror image of the other. Each housing member 40, 42 has transverse walls 44, 46, 48, and 50 that when joined together form interior cavities 52, 54 and 56. The interior cavities 52 and 56 respectively receive first and second compressible elements 58, 60. Each housing member 40, 42 has portions of bore 62 that extends axially through the housing for receiving the probing tip assembly 32. Extending from the far end of the housing 30 is an optional coaxial cable strain relief 64. The probing tip assembly and the coaxial cable 24 are free to move axially within the housing 30 and the optional coaxial cable strain relief 64.

In one embodiment of the invention, the coaxial cable 24 is formed from a flexible semi-rigid coaxial cable, such as manufactured and sold by Tensolite, Corp., St. Augustine, Fla., under the trade name Semi-Flex®. The Semi-Flex has a central signal conductor and an tightly braided outer shielding conductor 72 formed of an electrically conductive material that is covered with an insulating material 74. A portion of the outer insulating material 74 is removed from the cable 24, and the exposed braided portion of the outer shielding conductor 72 is dipped in a liquid solder. The solder flows into the braid and stiffens that portion of the cable to form an unbending semi-rigid coaxial cable 76. The unbending semi-rigid coaxial cable 76 forms the probing tip assembly 32 with the free end of the semi-rigid coaxial cable 76 having the probing tip 34 extending therefrom. The probing tip 34 is preferably secured to a resistive element 78 that is electrically coupled to the center signal conductor of the semi-rigid coaxial cable 76. An optional ground probing tip 80 may be disposed adjacent to the probing tip 34 and is electrically coupled to the outer shielding conductor 72 of the semi-rigid coaxial cable 76. In the preferred embodiment the ground probing tip 80 is a retractable, spring loaded probing tip that is attached to a slotted collar 82 that fits around outer shielding conductor 72 of the semi-rigid coaxial cable 76.

In the first embodiment of the invention, the first compressible element 58 is a first compression spring 92 positioned on the semi-rigid coaxial cable 76. One end of the first compression spring 92 is fixedly positioned on the semi-rigid coaxial cable 76 by abutting against a retention plate 94 that is secured to the outer shielding conductor 72 of the semi-rigid coaxial cable 76. The retention plate 94 has a bore 96 there through for receiving the semi-rigid coaxial cable 76 and may be secured to the outer shielding conductor 72 using solder, epoxy, or the like. The opposing side of the retention plate 94 abuts the transverse wall 44 in the housing 30. The other end of the first compression spring abuts the transverse wall 46 such that the first compression spring 92 is compressed between the transverse walls 44 and 46 within the interior cavity 52. While the present embodiment uses the retention plate 94 to fixedly position the first compression spring 92 on the semi-rigid coaxial cable 76, other devices and methods may be used to fixedly position the first compression spring 92 on the semi-rigid coaxial cable 76. One such device would be a compression spring retention member secured to outer shielding conductor 72 of the semi-rigid coaxial cable 76. The retention spring retention member has a collar that fits over the semi-rigid coaxial cables 76. The collar are formed of a solid material, such as metal, ABS plastic, or the like. The collar is placed on the semi-rigid coaxial cables 76 and secured to the semi-rigid coaxial cables 76 with an adhesive, such as epoxy, Locktite® or the like. In whatever form the compression spring 92 is fixed to the semi-rigid coaxial cable 76, it is important that the fixed end of the spring 92 is stopped by the transverse wall 44 so as to maintain compression on the spring 92.

The second compressive element 60 is a second compressive spring 102 positioned on the semi-rigid coaxial cable 76. One end of the second compression spring 102 abuts a pressure plate 104 having a bore 106 there through for positioning the pressure plate 104 around the semi-rigid coaxial cable 76. The pressure plate 104 is free to move along the semi-rigid coaxial cable 76. The pressure plate 104 abuts the transverse wall 48 and closely fits in the interior cavity 56. The other end of the second compression spring 102 abuts the transverse wall 50 such that the second compression spring 102 is compressed between the transverse walls 48 and 50 within the interior cavity 56. An actuator 108 is disposed within the interior cavity 54 and fixedly positioned on the outer shielding conductor 72 of the semi-rigid coaxial cable 76. The actuator 108 has a base plate 110 having a bore 112 there through for receiving the semi-rigid coaxial cable 76. The base plate 110 may be secured to the outer shielding conductor 72 using solder, epoxy, or the like. Extending from the base plate 110 toward the second compressible element 60 are protrusions 114. The protrusions 114 pass through apertures 116 formed in the transverse wall 48 and engage the pressure plate 104 during movement of the housing 30 relative to the probing tip assembly 32.

Figure 4:
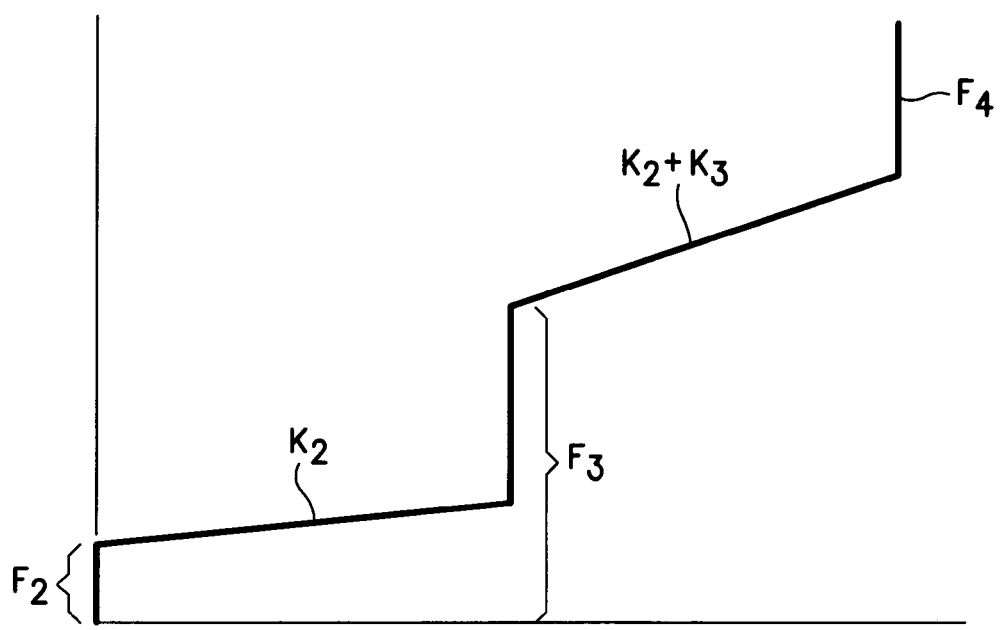
FIG. 4 is a graphical representation of the combined forces applied to the probing tip assembly by first and second compressible elements in the signal acquisition probe according to the present invention.

The probing tip assembly 32 has an initial force applied to it by the first pre-loaded compressive force of first compression spring 92 of the first compressible element 58 compressed between the transverse walls 44, 46 in the housing 30 as represented by the force $F_2$ in FIG. 4. The forces applied to the probing tip assembly 32 by the first and second compression springs follows Hook's law of $F=K\Delta X$ where K is the spring constant of the compression spring and $\Delta X$ is the displacement of the spring from its initial equilibrium position. With the probing tip 34 positioned on a device under test, downward movement of the housing 30 relative to the probing tip assembly 32 causes the transverse wall 46 to compress the first compression spring 92 between the fixed retention plate 94 and the transverse wall 46 as represented by the sloping line $K_2$. The force applied to the probing tip assembly 32 and correspondingly to the probing tip 34 is the combination of the first pre-loaded compressive force $F_2$ plus the increasing force required by the spring constant $K_2$ of the first compression springs 92.

The downward movement of the probe housing 100 causes the actuator 108 to move toward the pressure plate 104 in the interior cavity 56. When the protrusions 114 of the actuator 108 engage the pressure plate 104, the compression spring 102 of the second compressible element 60 generates a second pre-loaded compressive force $F_3$ against the probing tip assembly 32 by the pre-loaded compressive force of second compression spring 102 compressed between the pressure plate 104 and the transverse wall 50 in the housing 30 as represented by the force $F_3$ in FIG. 4. The second pre-loaded compressive force $F_3$ generates an immediate increase in force on the probing tip assembly 32 as represented by the vertical force line $F_3$ extending from the $K_2$ line in FIG. 4. This increase in force on the probing tip assembly 32 has a noticeable tactile feel to a user. The user feels the need to apply greater downward force on the housing 30 to move the housing relative to the probing tip assembly 32. Further, an increasing downward force is required to move the housing 30 relative to the probing tip assembly 32 because of the additive properties of the spring constants of the first and second compressible elements 58, 60 as represented by the sloping line $K_2+K_3$ where $K_3$ is the spring constant of the second compressible spring 102. Continued downward force on the housing 30 will cause the one or both of the compression spring 92, 102 to completely compress. Any continued downward pressure on the housing 30 transfers the force directly to the probing tip assembly 32 as represented by the vertical force line $F_4$ and not taken up by the compression springs.

The use of the first and second compressible elements 58, 60 provide increased protection for the components of the probing tip assembly 32 as compared to previous signal acquisition probes with a movable probing tip or housing. The increase in force required to move the housing 32 relative to the probing tip assembly 32 due to the second compressible element 60 provides a user with a tactile indication that sufficient pressure is being applied to the probing tip assembly 32. Further, the second compressible element 60 provides a pressure safety zone where additional downward force can be applied to the housing 30 without running the risk of causing damage to the probing tip assembly 32. Such a pressure safety zone was not available with the prior art probes.

Figure 5:
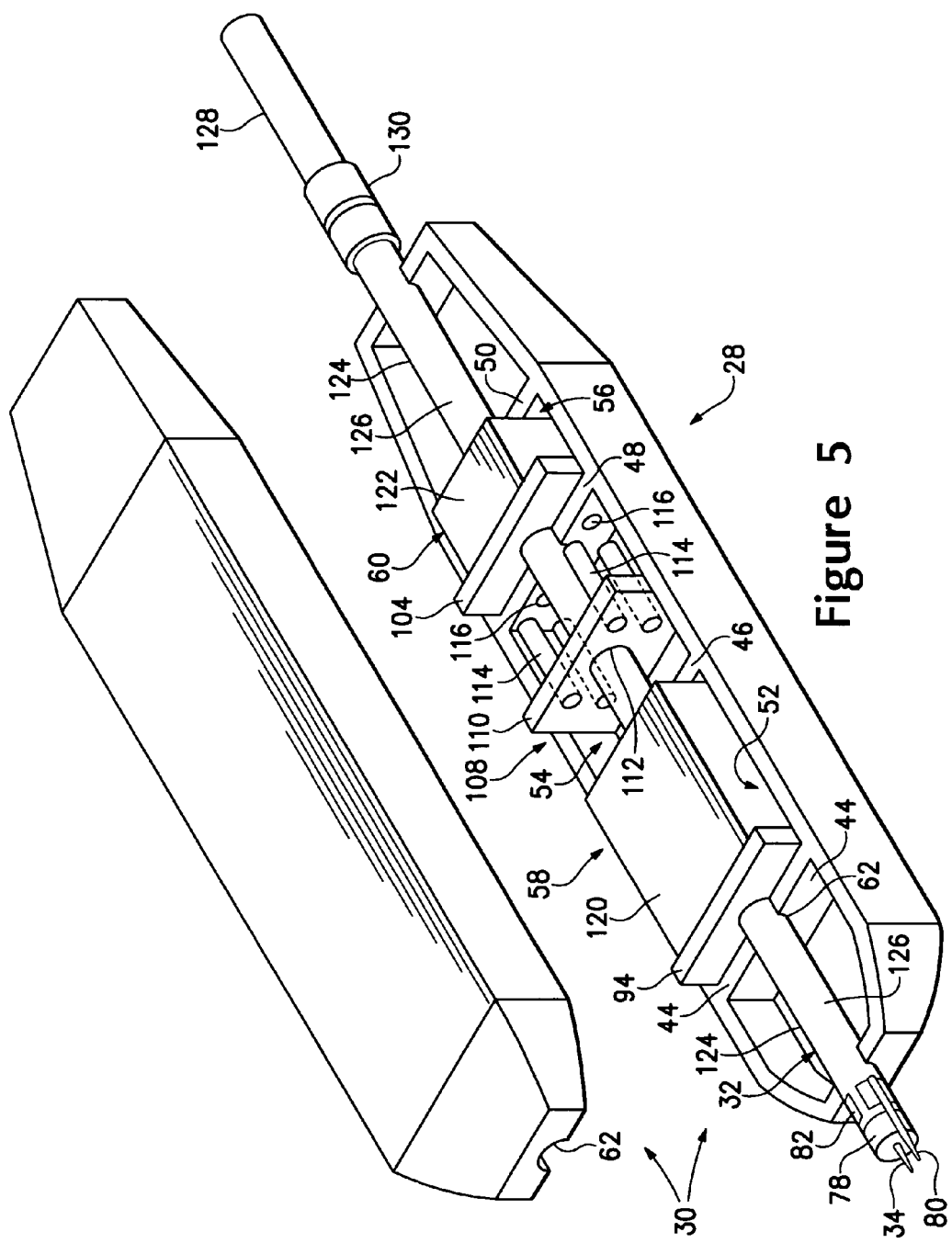
FIG. 5 is partially exploded view of a second embodiment of the signal acquisition probe according to the present invention.

Referring to FIG. 5, there is shown a further embodiment of the signal acquisition probe 28. Like elements from the previous drawing are labeled the same in FIG. 5. In this embodiment, the first and second compressible elements 58, 60 are first and second elastomeric materials 120, 122, such as a silicon material or the like, instead of the compression springs 92, 102. The first elastomeric material 120 is disposed in the interior cavity 52 of the housing 30 and abuts the retention plate 94 and the transverse wall 46. A bore is formed in the elastomeric material for receiving the semi-rigid coaxial cable 76. The bore is of sufficient size to allow the semi-rigid coaxial cable 76 to freely move within the elastomeric material 120 even when the material 120 is being compressed. Alternately, the elastomeric material 120 may be disposed adjacent the semi-rigid coaxial cable 76. The first elastomeric material 120 is compressed between the retention plate 94 and the transverse wall 46 to apply a first pre-loaded compressive force to the first elastomeric material 120 as represented by the first pre-loaded compressive force $F_2$ in FIG. 4. The first elastomeric material 120 exhibits a linear response to an applied force over the range of forces of interest as represented by the line $K_2$ in FIG. 4.

The second elastomeric material 122 is disposed in the interior cavity 56 in the housing 30 and abuts the pressure plate 104 and the transverse wall 48. As with the first elastomeric material 120, the second elastomeric material 122 may be disposed adjacent to the semi-rigid coaxial cable 76 or it may have a bore for receiving the semi-rigid coaxial cable 76. The second elastomeric material 122 is compressed between the pressure plate 104 abutting the transverse wall 48 and the transverse wall 50 to apply a second pre-loaded compressive force to the second elastomeric material 122 as represented by the second pre-loaded compressive force $F_3$ in FIG. 4. The second elastomeric material 122 also exhibits a linear response to an applied force over the range of forces of interest as represented by the line $K_3$ in FIG. 4.

The semi-rigid coaxial cable 76 formed by solder dipping the Semi-Flex coaxial cable is replaced with a standard semi-rigid coaxial cable 124 having a solid outer shielding conductor 126. The retention plate 94 and the actuator 108 are secured to the outer shielding conductor 126 by soldering or glueing with an epoxy. The semi-rigid coaxial cable 124 is connected to a flexible coaxial cable 128 by a coaxial connector 130.

The signal acquisition probe 28 of this embodiment functions in a similar manner to the previously described embodiment. The first elastomeric material 120 applies a first pre-loaded compressive force $F_2$ on the probing tip assembly 32. Downward movement of the housing relative to the probing tip assembly 32 compresses the first elastomeric material producing an increasing force on the probing tip assembly 32 as represented by the line $K_2$ in FIG. 4. When the protrusions 114 of the actuator 108 engage the pressure plate 108, the second elastomeric material 122 of the second compressible element 60 generates a second pre-loaded compressive force $F_3$ against the probing tip assembly 32 by the second pre-loaded compressive force of second elastomeric material 122 compressed between the transverse walls 48, 50 in the housing 30 as represented by the force $F_3$ in FIG. 4. The second pre-loaded compressive force $F_3$ generates an immediate increase in force on the probing tip assembly 32 as represented by the vertical force line $F_3$ extending from the $K_2$ line in FIG. 4. As previously stated, an increasing downward force is required to move the housing 30 relative to the probing tip assembly 32 because of the additive properties of the elastic modulus of the elastomeric materials 120, 122 of the first and second compressible elements 58, 60 as represented by the sloping line $K_2+K_3$. Continued downward force on the housing 30 will further compress the elastomeric materials 120, 122 to that point where any continued downward pressure on the housing 30 transfers the force directly to the probing tip assembly 32 as represented by the vertical force line $F_4$.

Figure 6:
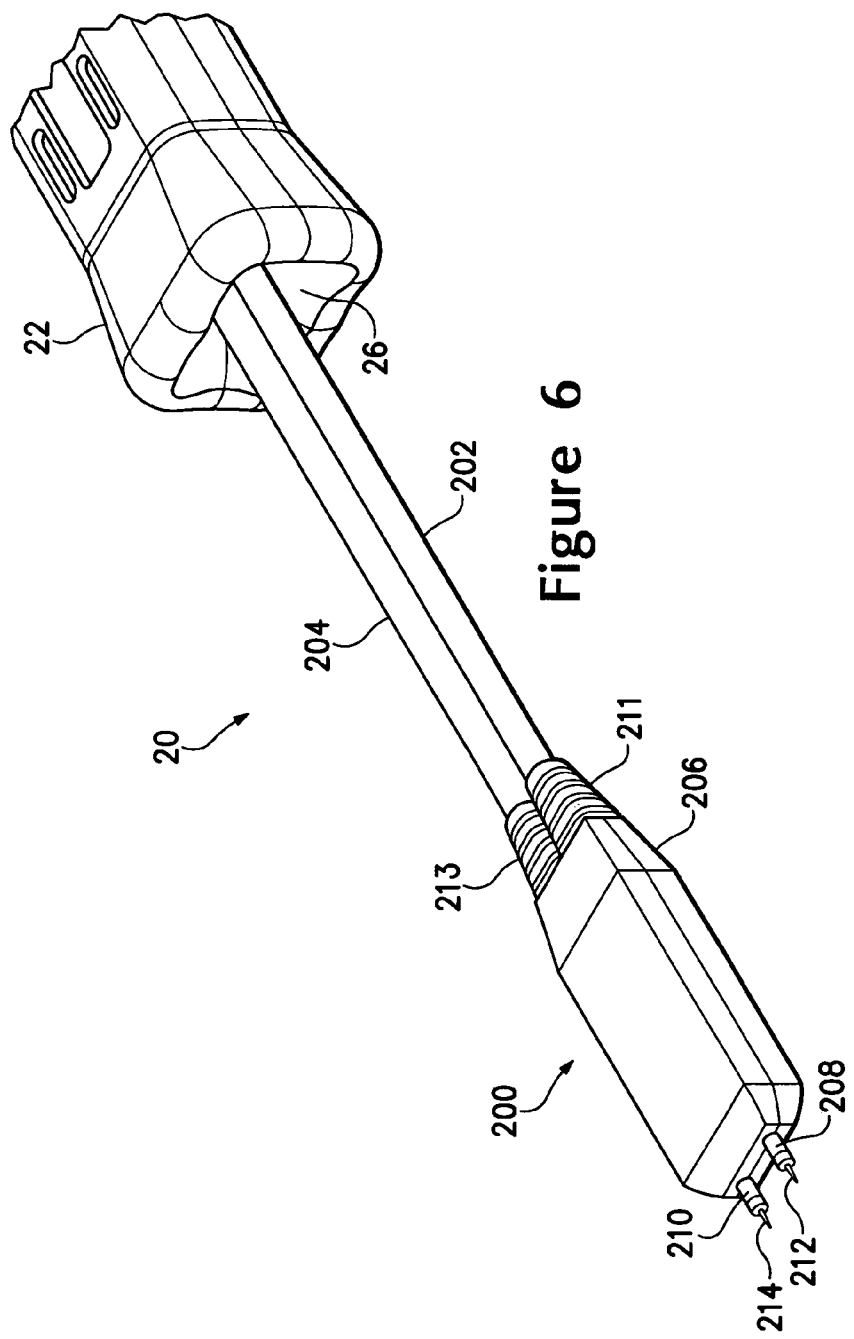
FIG. 6 is perspective view of a measurement probing system incorporating a differential signal acquisition probe according to the present invention.

Two probing tip assemblies 32 may be combined into a differential signal acquisition probe 200 as illustrated in FIG. 6. Like elements from the previous drawings are labeled the same in FIG. 6. The probe body 22 of the measurement probing system 20 has two coaxial cables 202, 204 extending through the inverted strain relief 26. The coaxial cables 202, 204 are coupled to the differential signal acquisition probe 200. The differential signal acquisition probe 200 has a housing 206 in which are disposed first and second probing tip assemblies 208, 210. Each probing tip assembly 208, 210 is formed with a probing tip 212, 214 extending from the housing 206. Each of the probing tip assemblies 208, 210 and the coaxial cables 202, 204 are free to move axially in the housing 206 and any optional strain relief boots 211, 213 that may be attached to the coaxial cables at the housing 206.

Figure 7:
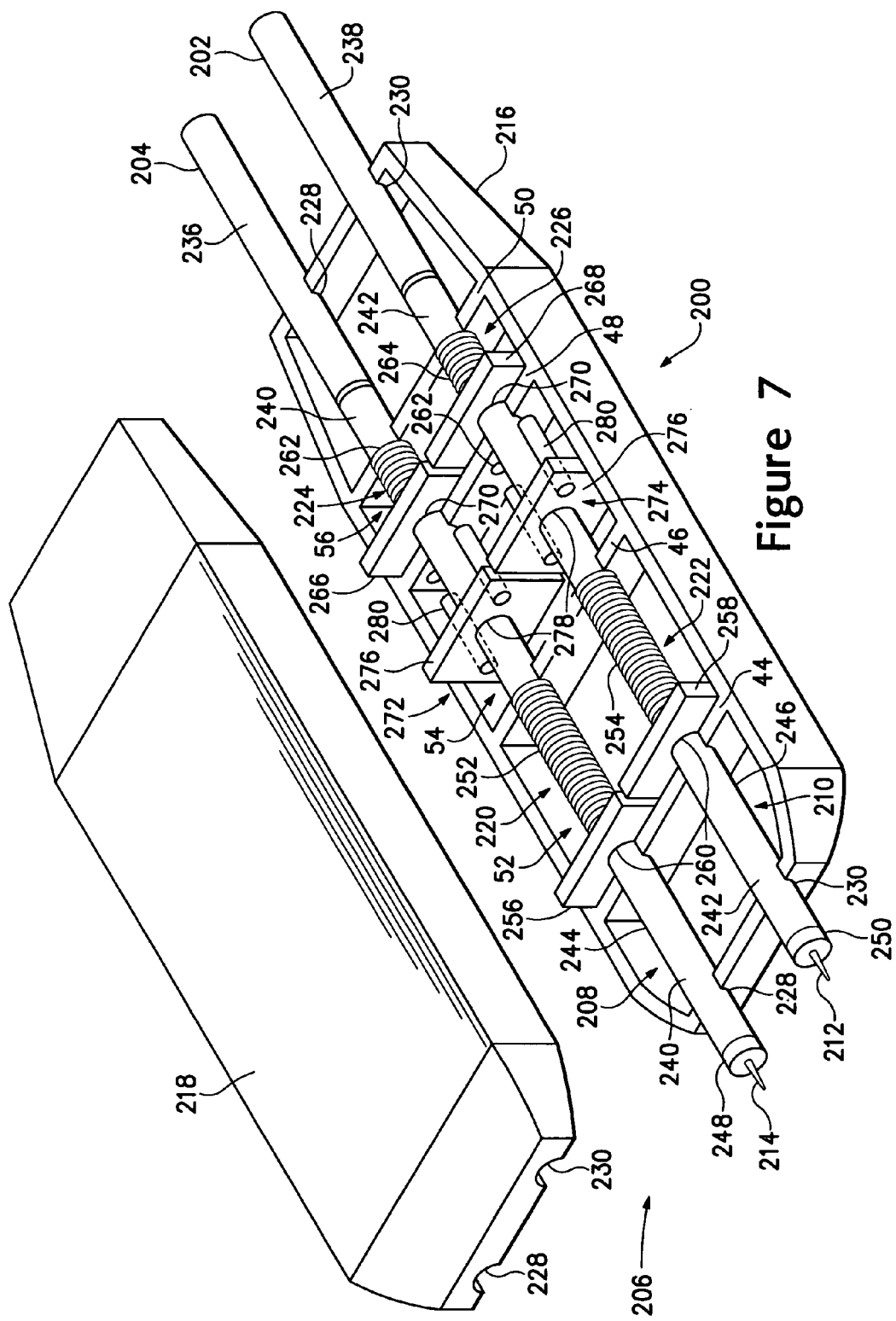
FIG. 7 is a partially exploded view of a first embodiment of the differential signal acquisition probe according to the present invention.

Referring to FIG. 7, there is shown a perspective view of the interior of the differential signal acquisition probe 200. Like elements from the previous drawings are labeled the same in FIG. 7. The housing 206 has first and second housing members 216, 218 formed of an insulating material, such as ABS plastic, polycarbonate, or the like. Each housing member 216, 218 is substantially a mirror image of the other. Each housing member 216, 218 has transverse walls 44, 46, 48, and 50 that when joined together form interior cavities 52, 54 and 56. The interior cavity 52 receives the first compressible elements 220, 222 of the respective first and second probing tip assemblies 208, 210. The interior cavity 56 receives the second compressible elements 224, 226 of the respective first and second probing tip assemblies 208, 210. Each housing member 216, 218 has a portion of bores 228, 230 that extend axially through the housing 206 for receiving the respective first and second probing tip assemblies 208, 210.

The probing tip assemblies 208, 210 are formed in the same manner as previously described for the probing tip assembly 32 in the embodiment of FIG. 3. A portion of the outer insulating materials 236, 238 are removed from the Semi-Flex cables 202, 204, and the exposed braided portions of the outer shielding conductors 240, 242 are dipped in a liquid solder. The solder coated Semi-Flex cables form semi-rigid coaxial cables 244, 246 with the free ends of the semi-rigid coaxial cables 244, 246 having the probing tips 212, 214 extending therefrom. Each of the probing tips 212, 214 is preferably secured to a resistive element 248, 250 that is electrically coupled to one of the center signal conductors of the semi-rigid coaxial cables 244, 246.

In the first embodiment of the differential signal acquisition probe 200, first compressible elements 220, 220 are first compression springs 252, 254 positioned on the semi-rigid coaxial cables 244, 246. One end of each of the first compression springs 252, 254 is fixedly positioned on the semi-rigid coaxial cables 244, 246 by abutting against respective retention plates 256, 258 that are secured to the outer shielding conductors 240, 242 of the respective semi-rigid coaxial cables 244, 246. Each retention plate 256, 258 has a bore 260 there through for receiving one of the semi-rigid coaxial cable 244, 246 and may be secured to the outer shielding conductors 240, 242 using solder, epoxy, or the like. The opposing sides of the retention plates 256, 258 abut the transverse wall 44 in the housing 30. The other ends of the first compression springs abut the transverse wall 46 such that the first compression springs 252, 254 are compressed between the transverse walls 44 and 46 within the interior cavity 52. While the present embodiment uses the retention plates 256, 258 to fixedly position the first compression springs 252, 254 on the semi-rigid coaxial cables 244, 246, other devices and methods may be used to fixedly position the first compression spring 252, 254 on the semi-rigid coaxial cable 244, 246, such as the previously described compression spring retention member secured to outer shielding conductors 240, 242 of the semi-rigid coaxial cables 244, 246.

The second compressive elements 224, 226 are second compressive springs 262, 264 positioned on the semi-rigid coaxial cables 244, 246. One end of each of the second compression springs 224, 226 abuts against a pressure plate 266, 268 having a bore 270 there through for positioning the pressure plates 266, 268 on the semi-rigid coaxial cables 244, 246. The pressure plates 266, 268 abuts the transverse wall 48 and closely fit in the interior cavity 56. The other ends of the second compression springs 262, 264 abut the transverse wall 50 such that the second compression springs 262, 264 are compressed between the transverse walls 48 and 50 within the interior cavity 56. First and second actuators 272, 274 are disposed within the interior cavity 54 and fixedly positioned on the respective outer shielding conductors 240, 242 of the semi-rigid coaxial cables 244, 246. Each actuator 272, 274 has a base plate 276 having a bore 278 there through for receiving one of the semi-rigid coaxial cable 244, 246. Each base plate 276 may be secured to the outer shielding conductors 240, 242 using solder, epoxy, or the like. Extending from each of the base plates 276 toward the second compressible element 224, 226 are protrusions 280. The protrusions 280 of each actuator 272, 274 pass through apertures 282 formed in the transverse wall 48 and engage the pressure plates 266, 268 during movement of the housing 206 relative to the probing tip assemblies 208, 210.

The compressive forces applied to each of the probing tip assemblies 208, 210 are the same as previously described for the probing tip assembly 32. The first compressible elements 220 and 222 apply first pre-loaded compressive forces on the probing tip assemblies 208, 210 as represented by the force $F_2$ in FIG. 4. Downward movement of the housing 206 relative to the probing tip assemblies 208, 210 produces an increasing force on the probing tip assemblies 208, 210 as a result of the compression applied to the first compressible elements 220, 222 as represented by the sloping line $K_2$ in FIG. 4. The second compressible elements 224, 226 apply second pre-loaded compressive forces to the probing tip assemblies 208, 210 subsequent to the increasing forces on the probing tip assemblies 208, 210 by the first compressible elements 220, 222 as represented by the force $F_3$ in FIG. 4. The second pre-loaded compressive force $F_3$ generates an immediate increase in force on the probing tip assemblies 208, 210 as represented by the vertical force line $F_3$ extending from the $K_2$ line in FIG. 4. An increasing downward force is required to move the housing 206 relative to the probing tip assemblies 208, 210 due to the additive properties of the spring constants of the first and second compressible elements 220, 224 and 222, 226 as represented by the sloping line $K_2+K_3$ where $K_3$ is the spring constant of the second compressible springs 262, 264. Continued downward force on the housing 206 will cause the one or both of the first and second compressible elements 220, 222, 224, 226 to completely compress. Any continued downward pressure on the housing 206 transfers the force directly to the probing tip assemblies 208, 210 as represented by the vertical force line $F_4$ and not taken up by the compression springs.

Figure 8:
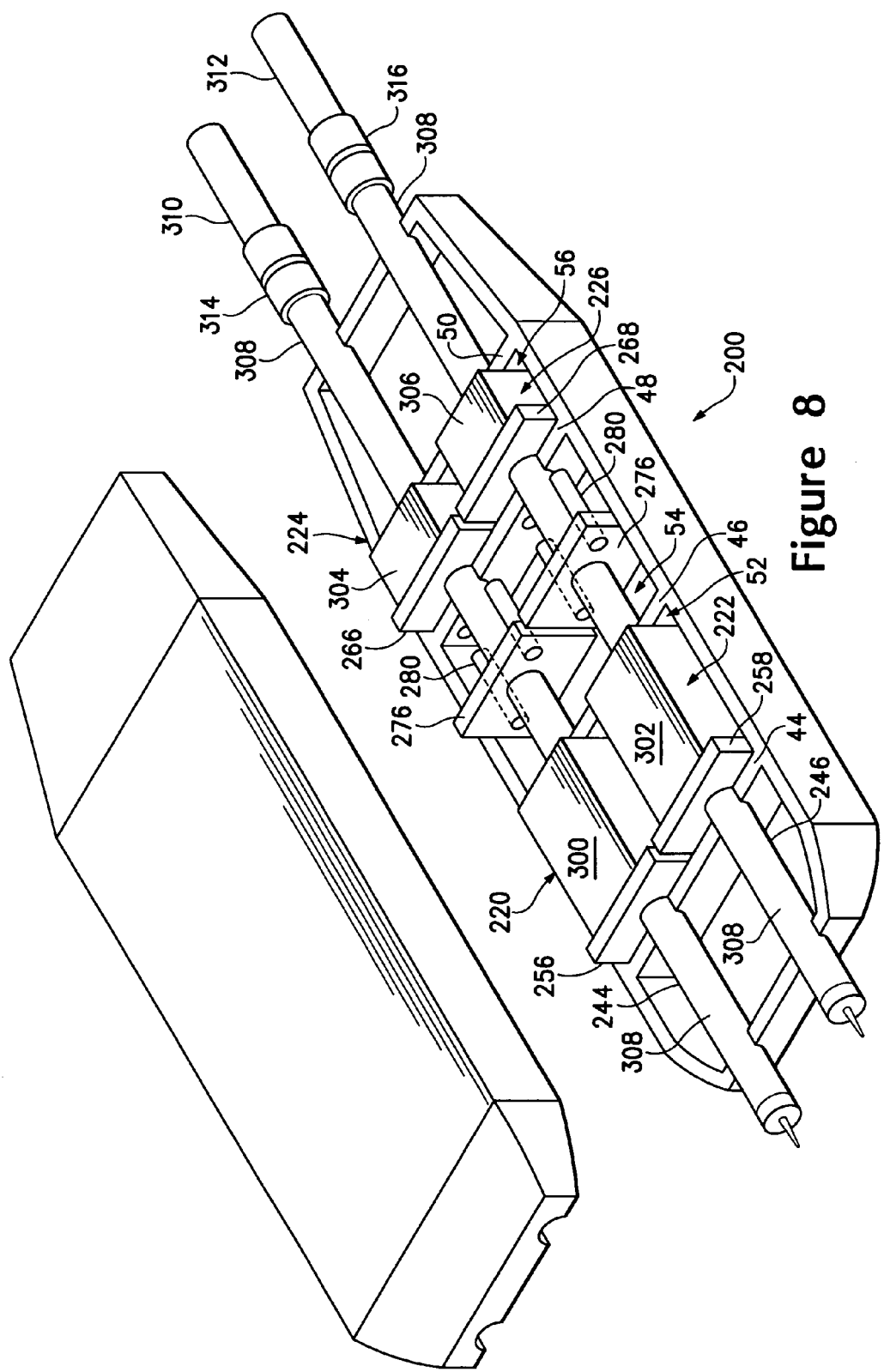
FIG. 8 is a partially exploded view of a second embodiment of the differential signal acquisition probe according to the present invention.

Referring to FIG. 8, there is shown a further embodiment of the differential signal acquisition probe 200. Like elements from the previous drawing are labeled the same in FIG. 8. In this embodiment, the first and second compressible elements 220, 222, 224 and 226 are first and second elastomeric materials 300, 302, 204 and 306, formed of a silicon material or the like, instead of compression springs 252, 254, 262, 264. The first elastomeric materials 300, 302 are disposed in the interior cavity 52 of the housing 206 and captured between the respective retention plates 256, 258 and the transverse wall 46. Bores are formed in the elastomeric materials 300, 302 for receiving the semi-rigid coaxial cable 244, 246.

The bores are of sufficient size to allow the semi-rigid coaxial cables 244, 246 to freely move within the elastomeric materials 300, 302 even when the materials 300, 302 are being compressed. Alternately, the elastomeric materials 300, 302 may be disposed adjacent to the semi-rigid coaxial cables 244, 246. The first elastomeric materials 300, 302 are compressed between the retention plates 256, 258 and the transverse wall 46 to apply first pre-loaded compressive forces to the first elastomeric materials 300, 302 as represented by the first pre-loaded compressive force $F_2$ in FIG. 4. The second elastomeric materials 304, 306 are disposed in the interior cavity 56 in the housing 206 and abut the respective pressure plates 266, 268 and the transverse wall 50. As with the first elastomeric materials 300, 302, bores are formed in the materials 304, 306 for receiving the semi-rigid coaxial cables 244, 246 or the disposed adjacent to the semi-rigid coaxial cables 244, 246. The second elastomeric materials 304, 306 are compressed between the respective pressure plate 266, 268 abutting the transverse wall 48 and the transverse wall 50 to apply second pre-loaded compressive forces to the second elastomeric materials 304, 306 as represented by the second pre-loaded compressive force $F_3$ in FIG. 4.

The semi-rigid coaxial cables 244, 246 in this embodiment are standard semi-rigid coaxial cable having a solid outer shielding conductor 308. The retention plates 256, 258 and the first and second actuators 272, 274 are secured to the outer shielding conductor 308 by soldering or glueing with an epoxy. The semi-rigid coaxial cable 244, 246 are connected to a flexible coaxial cable 310, 312 by coaxial connectors 314, 316.

The differential signal acquisition probe 200 of this embodiment functions in a similar manner to the previously described embodiment. The first elastomeric materials 300, 302 apply first pre-loaded compressive forces $F_2$ on the probing tip assemblies 208, 210. Downward movement of the housing 206 relative to the probing tip assemblies 208, 210 independently compress the first elastomeric materials 300, 302 producing increasing forces on the probing tip assemblies 208, 210 as represented by the line $K_2$ in FIG. 4. When the protrusions 280 of the actuators 272, 274 engage the respective pressure plates 266, 268, the second elastomeric materials 304, 306 of the second compressible elements 224, 226 generate second pre-loaded compressive forces $F_3$ against the probing tip assemblies 208, 210 by the second pre-loaded compressive forces of second elastomeric materials 304, 306 compressed between the transverse walls 48, 50 in the housing 206 as represented by the force $F_3$ in FIG. 4. The second pre-loaded compressive force $F_3$ generates an immediate increase in force on the respective probing tip assemblies 208, 210 as represented by the vertical force line $F_3$ extending from the $K_2$ line in FIG. 4. As previously stated, an increasing downward force is required to move the housing 206 relative to the probing tip assemblies 208, 210 because of the additive properties of the elastic modulus of the elastomeric materials 300, 302, 204, 306 of the first and second compressible elements 220, 222, 224, 226 as represented by the sloping line $K_2+K_3$. Continued downward force on the housing 206 will further compress the elastomeric materials 300, 302, 304, 306 to that point where any continued downward pressure on the housing 206 transfers the force directly to the probing tip assemblies 208, 210 as represented by the vertical force line $F_4$.

Various embodiment of the present invention have been described where the first and second compressible elements have been compression springs or elastomeric materials. The invention may also be implemented with a combination of a compression spring and an elastomeric material. Further, other structures may be used to generate the first and second pre-loaded compressive forces and the first and second increasing forces. In any implementation, there needs to be a noticeable change in the force applied to the probing tip assembly or assemblies as the second compressible element acts upon the probing tip assembly.

It will be obvious to those having skill in the art that many changes may be made to the details of the above-described embodiments of this invention without departing from the underlying principles thereof. The scope of the present invention should, therefore, be determined only by the following claims.

The invention claimed is:

1. A signal acquisition probe comprising:
a probing tip assembly disposed within a housing formed from a semi-rigid coaxial cable having a probing tip at one end;
a first compressible element disposed within the housing applying a first pre-loaded compressive force to the probing tip assembly and a first increasing compressive force by axial movement of the housing relative to the probing tip assembly;
a second compressible element positioned around the semi-rigid coaxial cable of the probing tip assembly and disposed in the housing between opposing transverse walls with a pressure plate positioned on the semi-rigid coaxial cable and against one end of the second compressible element with the second compressible element being compressed between the opposing transverse walls of the housing to generate a second pre-loaded compressive force; and an actuator having a base plate positioned on the semi-rigid coaxial cable engaging the pressure plate positioned against the second compressible element providing the second pre-loaded compressive force to the probing tip assembly after the first compressible element provides the increasing compressive force to the probing tip assembly with the second compressible element providing a second increasing compressive force by further axial movement of the housing relative to the probing tip assembly.

2. The signal acquisition probe as recited in claim 1 wherein the semi-rigid coaxial cable further comprises a connector at the other end.

3. The signal acquisition probe as recited in claim 1 wherein the first compressible element further comprises a first compression spring positioned around the semi-rigid coaxial cable with one end of first compression spring fixedly positioned on the semirigid coaxial cable and the other end of the first compression spring abbutting a transverse wall in the housing with the first compression spring being compreessed between the fixed position on the semi-rigid coaxial cable and the transverse wall in the housing to generate the first pre-loaded compressive force.

4. The signal acquisition probe as recited in claim 1 wherein the second compressible element further comprises:
a second compression spring.

5. The signal acquisition probe as recited in claim 1 wherein the actuator further comprises a base plate secured to the semi-rigid coaxial cable and having at least a first protrusion extending from the base plate for engaging the pressure plate.

6. The signal acquisition probe as recited in claim 5 wherein at least the first protrusion passes through a bore formed in the transverse wall abutting the pressure plate.

7. The signal acquisition probe as recited in claim 1 wherein the first compressible element further comprises a first elastomeric material positioned around the semi-rigid coaxial cable with one end of the first elastomeric material fixedly positioned to the semi-rigid coaxial cable and the other end of the first elastomeric material abutting a transverse wall in the housing with the first elastomeric material being compressed between the fixed position on the semi-rigid coaxial cable and the transverse wall in the housing to generate the first pre-loaded compressive force.

8. The signal acquisition probe as recited in claim 1 wherein the second compressible element further comprises:
a second elastomeric material.

9. The signal acquisition probe as recited in claim 1 wherein the housing further comprises first and second housing members receiving the probing tip assembly, the first compressible element, and the second compressible element.

10. A differential signal acquisition probe comprising:
first and second probing tip assemblies disposed within a housing with each probing tip assembly formed from a semi-rigid coaxial cable having a probing tip at one end;
first compressible elements disposed within the housing with one of the compressible elements providing a first pre-loaded compressive force to the first probing tip assembly and a first increasing compressive force by axial movement of the housing relative to the first probing tip assembly and the other of the first compressible elements providing a first pre-loaded compressive force to the second probing tip assembly and a first increasing compressive force by axial movement of the housing relative to the second probing tip assembly; and second compressible elements with one of the second compressible elements positioned around the semi-rigid coaxial cable of the first probing tip assembly and another of the second compressible elements positioned around the second semi-rigid coaxial cable of the second probing tip assembly with each of the second compressible elements disposed in the housing between opposing transverse walls with respective pressure plates positioned around each of the semi-rigid coaxial cables and against one end of the respective second compressible elements with the second compressible elements being comprised between the opposing transverse walls in the housing for generating respective second pre-loaded compressive forces for the first and second probing tip assemblies; and respective actuators fixedly positioned on the semi-rigid coaxial cables of the first and second probing tip assemblies engaging the respective pressure plates positioned against the second compressible elements providing the pre-loaded compressive forces to the respective first and second probing tip assemblies after the respective first compressible elements provide the increasing compressive forces to the respective first and second probing tip assemblies with the second compressible elements providing a second increasing compressive force to each of the first and second probing tip assemblies by further axial movement of the housing relative to the first and second probing tip assemblies.

11. The signal acquisition probe as recited in claim 10 wherein each semi-rigid coaxial cable of the first and second probing tip assemblies further comprises a connector at the other end.

12. The signal acquisition probe as recited in claim 10 wherein the first compressible elements further comprise first compression springs positioned around respective the semi-rigid coaxial cables of the first and second probing tip assemblies with one end of the respective first compression spring fixedly positioned on the respective semi-rigid coaxial cables of the first and second probing tip assemblies and the other end of the respective first compression springs abutting a transverse wall in the housing with the first compression springs being compressed between the fixed positions on the respective semi-rigid coaxial cables and the transverse wall in the housing to generate the first pre-loaded compressive forces on the first and second probing tip assemblies.

13. The signal acquisition probe as recited in claim 10 wherein each of the second compressible elements further comprises:
a second compression spring.

14. The signal acquisition probe as recited in claim 10 wherein each of the actuators of the second compressible elements further comprises a base plate secured to the semi-rigid coaxial cable and having at least a first protrusion extending from the base plate for engaging the pressure plate.

15. The signal acquisition probe as recited in claim 14 wherein at least the first protrusion of each of the respective base plates passes through a bore formed in the transverse wall abutting the pressure plate.

16. The signal acquisition probe as recited in claim 10 wherein each of the first compressible elements further comprise a first elastomeric materials positioned around the respective semi-rigid coaxial cables of the first and second probing tip assemblies with one end of the respective first elastomeric material abutting a transverse wall in the housing with the first elastomeric materials being compressed between the fixed positions on the first pre-loaded compressive forces on the first and second probing tip assemblies.

17. The signal acquisition probe as recited in claim 10 wherein each of the second compressible element further comprises:
a second elastomeric material.

18. The signal acquisition probe as recited in claim 10 wherein the housing further comprises first and second housing members receiving the first and second probing tip assemblies, the first compressible elements, and the second compressible elements.

* * * * *